United States Patent [19]

Deficis et al.

[11] 4,177,422

[45] Dec. 4, 1979

[54] APPARATUS AND PROCESS FOR GENERATING AN IONIZED GAS OR PLASMA BY MICROWAVE ENERGY

[75] Inventors: Alain Deficis; Marie-Edith Gimonet, both of Ramonville Saint-Agne; Alain Priou, Castanet-Tolosan; Christian Fournet-Fayas, Fenouillet, all of France

[73] Assignee: Agence Nationale de Valorisation de la Recherche (A.N.V.A.R.), Neuilly-sur-Seine, France

[21] Appl. No.: 852,748

[22] Filed: Nov. 18, 1977

[30] Foreign Application Priority Data

Nov. 19, 1976 [FR] France .............................. 76 35308

[51] Int. Cl.$^2$ .................... G01R 21/04; G01R 19/00
[52] U.S. Cl. ................................ 324/95; 315/248; 324/122; 325/67
[58] Field of Search ............... 324/95, 122; 315/111.2, 315/248, 227 R; 219/121 P; 313/231.3; 325/363, 67; 343/703

[56] References Cited

U.S. PATENT DOCUMENTS

| 2,525,624 | 10/1950 | Stahl et al. | 315/248 |
| 2,822,508 | 2/1958 | Rabette | 315/248 |

*Primary Examiner*—Rudolph V. Rolinec
*Assistant Examiner*—Ernest F. Karlsen
*Attorney, Agent, or Firm*—Shlesinger, Arkwright, Garvey & Dinsmore

[57] ABSTRACT

A method and apparatus for the generation of an ionized gas or plasma for measurement of ultra-high frequency electromagnetic radiation utilizing a casing containing an ionizable gas, an oscillating circuit comprising an inductor and a capacitor in the casing, the oscillating circuit being adapted to resonate at a predetermined resonance frequency in the ultra-high frequency range and to have a Q factor in a vacuum of greater than 1 in order to render the circuit capable of producing a firing voltage across the capacitor for ionizing the gas when the inductor receives electromagnetic radiation near the resonance frequency, the casing further including optical conducting means having one end attached to the casing near the capacitor and means attached to the other end of the optical conducting means for analyzing the light transmitted from the conductor as a function of the power of the electromagnetic radiation.

16 Claims, 16 Drawing Figures

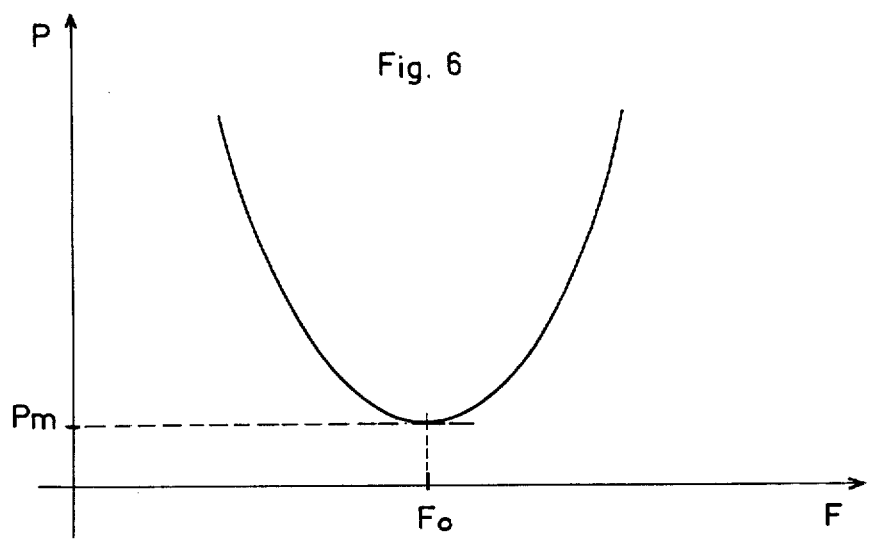
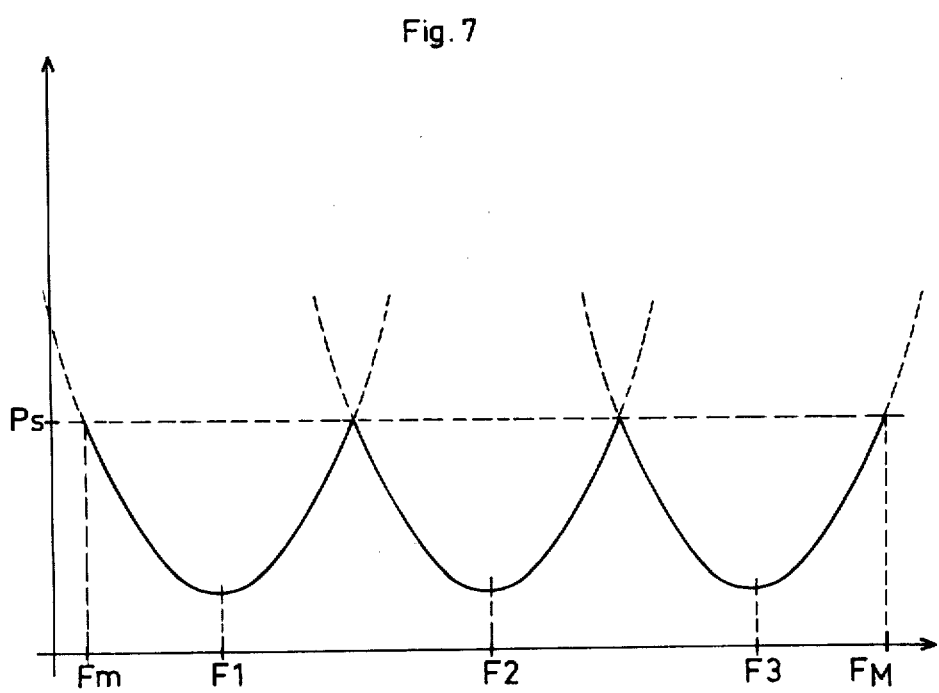

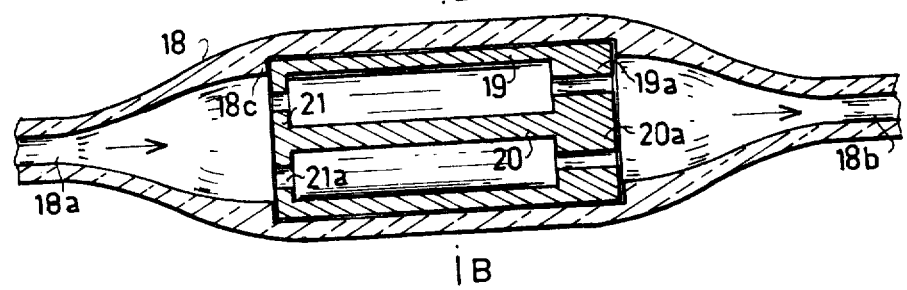
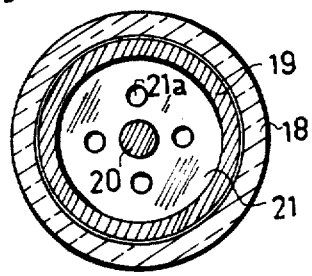
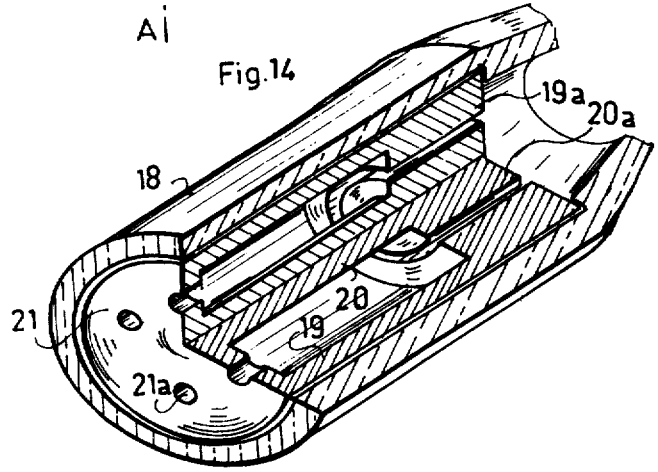

APPARATUS AND PROCESS FOR GENERATING AN IONIZED GAS OR PLASMA BY MICROWAVE ENERGY

The invention relates to an ionized gas or plasma generator, with the gas or plasma generated by electromagnetic radiation. It extends to any application of the device, particularly in the field of detection and measurement of electromagnetic radiation. It can be used in the production by means of a plasma of certain compounds such as ozone, or in the field of laser modulation, plasma spectroscopy, or cleansing of fluids, etc.

Electromagnetic radiation frequencies between 500 megahertz and approximately 300,000 megahertz is customarily designated as super high frequency, microwave or ultra-high frequency electromagnetic radiation.

The device known today for generation of gas ionization by means of ultra-high frequency radiation include all of the accessory electric or electronic means for firing and maintenance of the ionization. These accessory means include an electric energy source connected to a discharge means such as electrodes forming a dipole or the like, situated in the ionizable gas (see e.g. U.S. Pat. No. 3,423,679, P. H. SMITH). The auto-firing concept employing only moderate power electromagnetic radiation is thought by those skilled in the art to be impossible.

Firing means represent a serious inconvenience due to manufacture costs, undue bulk, and consumption of energy. Also, in the field of detection and measurement of electromagnetic radiation, these firing means, connected by conductors to a discharge means, introduce a major disturbance in the radiation field to be measured. This disturbance is aggravated by the presence of wiring generally provided in this type of device, to transmit the measuring signals to an indicator apparatus. The indication furnished by any of these devices is generally erroneous, except in certain particular cases, where the orientation of the electromagnetic field is clearly defined and known in advance.

The present invention proposes a device for the ionization under the effect of only electromagnetic radiation.

One object of the invention is to abolish all outside means for electric or electronic excitation connected with the device, in order to eliminate those particular faults.

Another object of the invention is to allow generation of an ionized gas or plasma with the aid of moderate power ultra-high frequency radiation.

Another object of the invention is to describe methods for using this device to detect and measure ultra-high frequency electromagnetic radiation.

Another object of the invention is to precisely measure electromagnetic field density and to define the orientation of the radiated field. The invention also provides a measuring method for the optimum application of this device.

Another object is to furnish a self-contained device which is not cumbersome, and which is adapted to detect radiation above a predetermined threshold power.

The generator device for ionized gas or plasma according to the invention includes a casing containing an ionizable gas and at least one self-contained and insulated oscillating circuit, composed of an autoinductor and a capacitor situated in the casing. The inductor and the capacitor are adapted on the one hand to resonate at a predetermined frequency $F_o$ within the range of ultra-high frequencies, and to produce Q factor of $Q_o$ greater than 1 in a vacuum in order to adapt said circuit to produce a firing voltage in the capacitor. This will assure the ionization of the gas under the effect of electromagnetic radiation whose frequency is near the $F_o$ frequency.

Preferably, the autoinductor and the capacitor of the oscillating circuit are adapted to have a Q factor of $Q_o$ in a vacuum which is approximately 100. For this, the parameters of the circuit are adjusted to satisfy the following relations:

$$(2\pi F_o L)/R = 1/(2\pi F_o CR) = Q_o \geq 100$$

wherein L is the reactance of the inductor, C is the capacitance of the capacitor, and R is the resistance of the circuit.

In the absence of any electric excitation from the outside, when the device is placed in an ultra-high frequency field near frequency $F_o$, its oscillating circuit is capable of storing a large quantity of energy during each period of ultra-high frequency radiation. Even if the radiation power is relatively low, a firing voltage will develop across the capacitor of the circuit and raise the ionization of the gas. When the gas is ionized, the capacitor is practically short-circuited and the Q factor of the $Q_c$ load becomes very weak, so that the circuit then has a negligible influence and exhibits only a very small loss of power. In the case of de-energization, the Q factor increases again to produce the firing. A plasma is thus generated by means of ultra-high frequency radiation alone and with a reduced power level.

Preferably, the casing constitutes a tube or an ampoule of dielectric material, to avoid parasitic losses of energy or disturbances to the radiation field.

According to the application, this casing can be hermetically sealed or can have an inlet opening and a discharge opening for circulation of ionizable gas.

When the plasma serves to detect electromagnetic radiation, the casing is to be hermetically sealed and of transparent, or translucent dielectric material. The device can be used to detect the presence of radiation of a greater magnitude than its threshold firing level. Dependent upon the nature of this gas, or by regulating the Q factor of the oscillating circuit. This threshold can be set by regulating the presence of the ionizable gas. Thus a self-contained device of very small dimensions can be used, to visually disclose the presence of an electromagnetic field.

For the measurement of a radiation, the device is provided with an optical conductor having one end attached to the casing near the capacitor and the other end associated with means for light analysis.

In order to use this device to measure electromagnetic field density the device is placed in the field where the power level (density) is to be measured, the ampoule is rotated at least 180° around a predetermined axis and the maximum amplitude of the light intensity is measured. This gives the power density of the radiated field by a suitable standardization.

To determine the orientation of the electric field, the same process is carried out and the relation of maximum amplitude and minimum amplitude of the light intensity is measured. This gives the value of the angle between the rotation axis of the ampoule and the electrical field, by suitable standardization.

To alleviate indefiniteness, it is possible to begin the measurement again at the same point, turning the ampoule around a different rotation axis. It is also possible to measure the field by following the direction a little at a time, starting from the point where it is well defined as in the central zone of a wave guide, air gap, etc.

Of the several different detection or measurement tactics used, the simplest and most frequently used method lies in the detection or measurement of electromagnetic radiation of a known frequency F. The process then consists of placing a device according to the invention in the field to be tested which has a frequency F close to $F_o$. The oscillating circuit can then resonate under the effect of the radiation to ionize the gas.

Another use is in the precise detection or measurement of electromagnetic radiation of an unknown frequency but in a known range. The process can consist of placing a device including several oscillating circuits calibrated at different and adjacent frequencies within the known range. The oscillator circuit, whose frequency resonance band includes the frequency of the incident radiation thus generates the firing of the device. Once fired, the response, i.e. the light intensity produced by the ionized gas is practically independent of the frequency of the radiation.

Another use is in the detection or measurement of electromagnetic radiation of an unknown frequency or frequencies which do not correspond to the resonant frequency of the available devices. The process then consists of placing a device which is calibrated at a known frequency $F_o$ in the field, and temporarily generating radiation of a frequency which is near $F_o$, in order to fire the device. Once the firing is obtained and the firing radiation interrupted, the response, which is practically independent of the frequency, permits detection and measurement of the radiation field.

The invention will be understood from the following detailed description relative to the attached drawings, which show embodiments of the invention:

FIG. 6 shows the firing curves of the devices of FIGS. 1 and 2.

FIG. 7 shows the firing curve of the device of FIG. 5.

FIG. 12 is an axial cross section along the line AA of a plasma generation device, particularly adapted to permit use of the plasma produced to treat a gas as in sterilization, production of ozone from oxygen, etc.

FIG. 13 is a radial cross section along the line BB of the device.

FIG. 14 is a partial perspective view with partial cutout.

Figure 1:
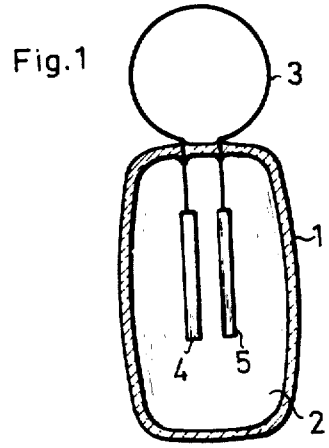
FIG. 1 shows an axial cross section of one embodiment of a device according to the invention for detection of ultra-high frequency radiation.

The detection device shown in FIG. 1 includes a closed ampoule 1 of glass with dimensions on the order of several millimeters, having an ionizable gas 2, for example neon, argon, or a mixture of the two, therein. The gas pressure is set to correspond to a minimum firing level. This pressure can be calculated in the traditional manner by the PASCHEN laws.

The ampoule is connected to an oscillating circuit comprising a small diameter metallic loop 3 outside the ampoule, which is the autoinductor, and two cylindrical metallic elements 4 and 5 inside of the ampoule. These metallic elements comprise the two plates of the capacitor in the LC network.

The geometric dimensions of these elements are such to produce a suitable resonance frequency $F_o$ these dimensions can be determined experimentally or by means of traditional calculations for example NAGAOKA formula, abacus or tables, so that the inductance L of the loop and the capacitance C of the capacitor will satisfy the following formula:

$$LC = 1/(4\pi^2 F_o^2)$$

It is possible, for example, to obtain a circuit resonant at the traditional frequency used in industry of 2450 Megahertz by using a Q factor in a vacuum on the order of 150, and by dimensioning the device as follows:
loop diameter, 5 mm
diameter of metallic wire used for the loop, 0.36 mm
diameter of cylindrical elements, 0.9 mm
distance between cylindrical elements, 1.1 mm
length of cylindrical elements, 5.6 mm It must be noted that the theoretical calculation of resonance frequency gives a value approximately 5% greater than the resonance frequency actually observed. This is due to parasitic inductances and capacitances which are not negligible at very high frequencies. It is thus advisable to take this factor into consideration if the determination of the circuit parameters is made by calculation.

The device can be adapted to detect electromagnetic radiation such as an accidental radiation originating from an electromagnetic furnace. The device can be mounted on the outside of the furnace near the furnace input or can also be carried by persons required to work in close proximity with the furnace in a ring medallion, etc.

The ionization is caused by the oscillating circuit when the electromagnetic power exceeds a minimum $P_m$ (FIG. 6). For example, a device with the dimensions (Q factor on the order of 150) can be used to detect electromagnetic leakage at 2450 Megahertz. The firing is produced at the time when the $P_m$ value equals 3 milliwatts per $cm^2$. The ionization of the gas produces visible light, showing detection of the radiation.

It is known that the danger threshold for humans to UHF radiation is 10 milliwatts per $cm^2$. Thus this device is suitable to detect leakage well before this threshold is reached.

Such a device is self-contained and of very small dimensions and is capable of detecting very low values of electromagnetic radiation.

Of course, the firing level $P_m$ can be set as a function of the application. This is done either by regulation of the gas pressure, by choice of different gases, or by adjusting the values of the inductor L and capacitor C while continuing to satisfy the $LC=1/(4\pi^2 F_o^2)$ factor.

Figure 2:
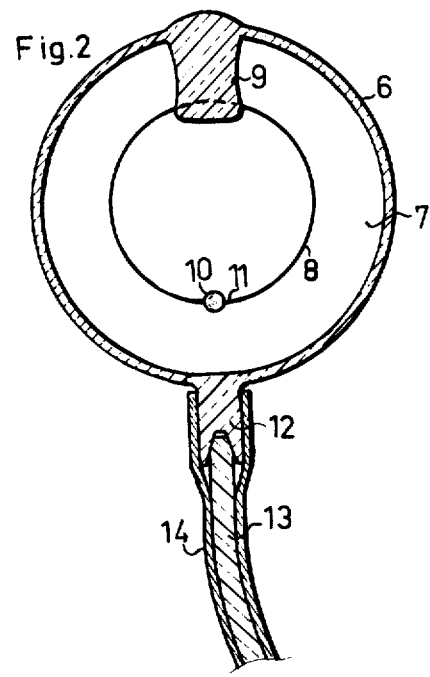
FIG. 2 shows an axial cross section of one embodiment of the invention for detection and measurement of ultra-high frequency radiation.

FIG. 2 shows a device adapted for measurement of electromagnetic power and for determination of the direction of the electric field E.

Figure 3:
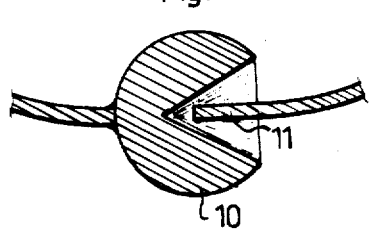
FIG. 3 is a detail view of one element of the device of FIG. 2.

The measuring device comprises a spherical ampoule 6 containing an ionizable gas 7 and an oscillating circuit which is formed by a metallic loop 8 held by means of a glass bead 9, and by two metallic elements 10 and 11 which are shown in cross section in FIG. 3.

In the example, the assembly of the oscillating circuit (loop 8 and elements 10 and 11) is located within the ampoule in the ionizable gas. Metallic elements 10 and 11 are preferably arranged such that element 10 has an axial cavity and element 11 penetrates into that cavity. This arrangement facilitates measurement by producing a response of perfectly annular form as defined by light intensity as a function of the orientation of the ampoule in the space, at constant electromagnetic power.

Metallic element 10 can be constructed of a metallic spherical bead, hard soldered on the end of the loop and provided with a conical cavity (FIG. 3). Element 11 would consist of the other end of the loop which penetrates into this cavity.

Figure 4:
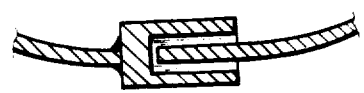
FIG. 4 is a detail view showing a variation of the element as shown in FIG. 3.

The metallic element can also be a cylindrical sleeve which surrounds the other element (FIG. 4).

The Q factor of such circuits is on the order of 150.

Additionally, the ampoule has a glass projection 12 for attaching an optical fiber or a bundle of optical fibers 13. This fiber or fiber bundle is protected by an opaque sheathing 14.

The fiber or fibers can be of any known type such as glass, methyl methacrylate, and may either by clad fibers or the gradient index type.

The firing curve is analogous to that of the proceding device (FIG. 6).

Figure 5:
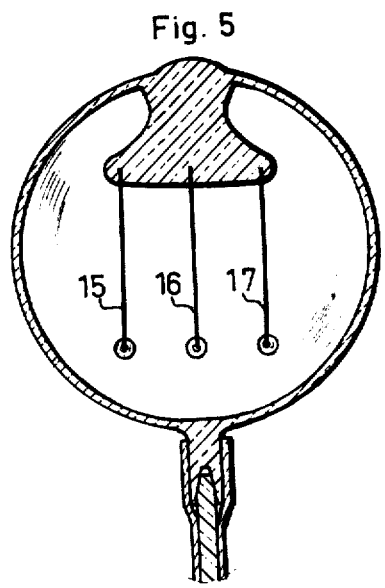
FIG. 5 shows an axial cross section through an orthogonal plane relative to the cross section plane of FIG. 2, of another embodiment of a device according to the invention.

To extend the frequency range ($F_{min}$, $F_{max}$) in which firing above power threshold $P_s$ is produced, it is possible to provide several oscillating circuits such as 15, 16 or 17 which are analogous to the above described circuit, but are set at different frequencies $F_{o1}$, $F_{o2}$, $F_{o3}$. FIG. 5 shows these circuits in profile.

Each resonanct frequency of these circuits is staggered in the $F_{min}$, $F_{max}$ range so that the firing bands of the circuits are adjacent for a minimum $P_s$; beyond this power level, the resonance of just one of the circuits generate the firing.

Figure 8:
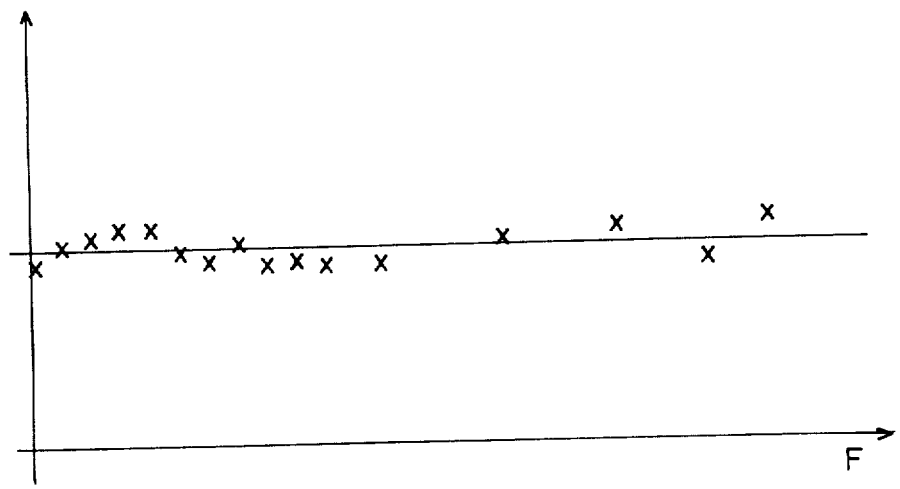
FIG. 8 is an experimental diagram showing, as a function of the frequency, the light intensity obtained by means of a device as in FIG. 2, with the electromagnetic power remaining constant.

Whatever the number of oscillating circuits provided, it has been established that when the device is fired and the gas is ionized, the light intensity transmitted through the fiber 13 depends only on the electromagnetic power of the field and the orientation of the ampoule in relation to the electric field. At a constant power and if the ampoule is immovable, the light intensity is essentially constant when the frequency varies as is shown by the measurements shown in FIG. 8. This is explained by the fact that the capacitor is practically short-circuited when the gas is ionized, so that the circuit behaves as a purely inductive closed circular antenna having a negligible Q factor ($Q_c$).

This type of antenna has a toric pattern. It is to be noted that this pattern is subjected to distorsions in relation to the ideal toric pattern, if the capacitor of the oscillating circuit is not of the type shown in FIGS. 3 and 4 in which the capacitor comprises one element which surrounds the other element by 360°. In FIG. 1, for example, the pattern is deformed by the effect of the ionizing gas in close proximity to the capacitor behaving as a parasite antenna. For a simple detection device, this deformation is not disturbing; but for a measuring device, it causes an error of several percentage points and it is preferable to provide a cavity type capacitor.

Figure 9:
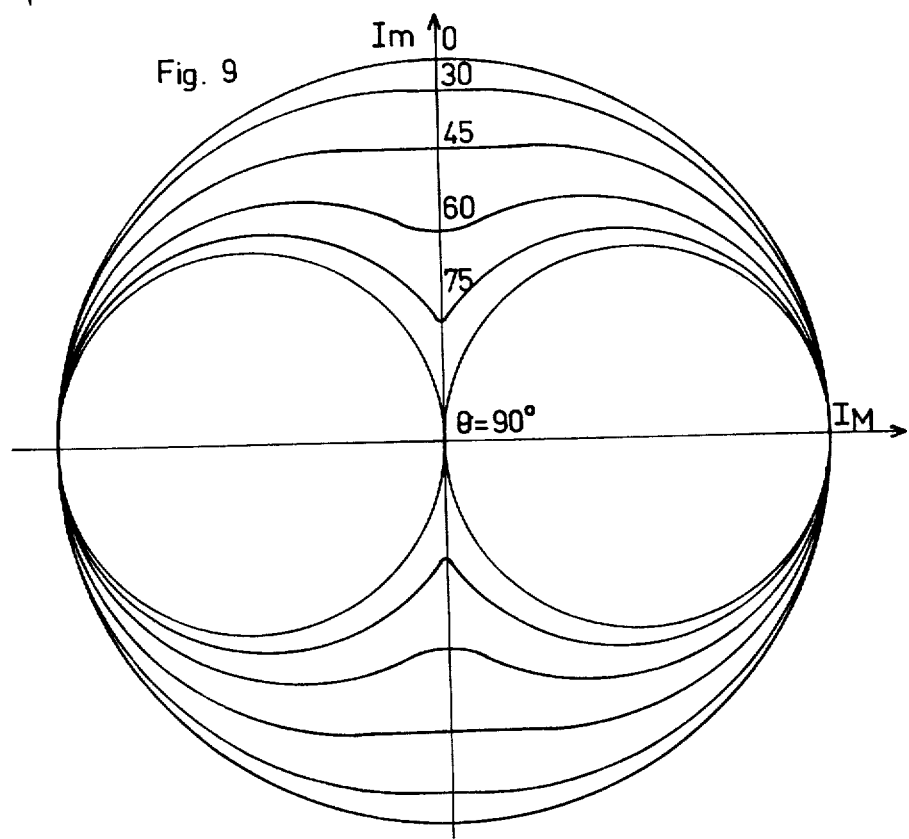
FIG. 9 is a diagram showing the polar curves of light intensity for various angles $\theta$ between the electrical radiation field and the rotation axis of the device. Each curve is obtained by turning the device 360° around the axis to be considered, and recording in polar coordinates, the light intensity measured as a function of the rotation angle.

FIG. 9 shows in polar coordinates the various response curves obtained when the ampoule is turned around different orientation axes in relation to the electric field E of radiation. Each curve is the intersection through one plane of the toric response pattern. For example, for $\theta = 0°$, the rotation axis of the ampoule coincident with the direction of field E, the curve consists of a circle, a trace of the torus on a median plane perpendicular to its axis; when this plane is inclined, this trace is deformed as in FIG. 9 until it reaches the configuration of two circles when $\theta = 90°$.

The maximum light intensity $I_{Max}$ obtained in the course of the different rotations remains constant and is a direct function of the density of the electromagnetic power of the field around the ampoule, whatever the value of $\theta$.

Figure 10:
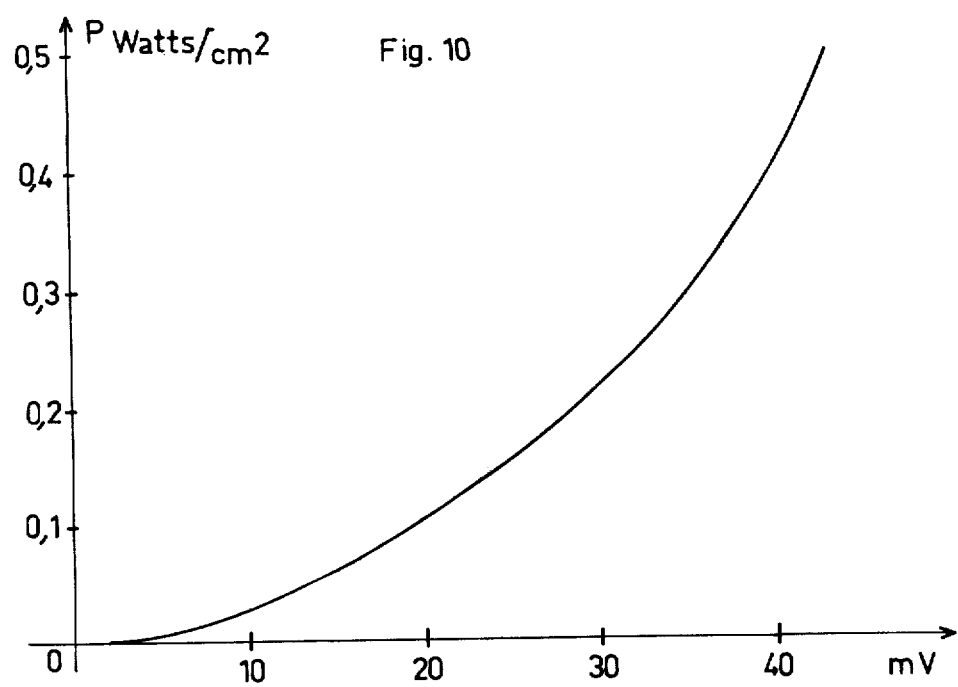
FIG. 10 is one example of a standardization curve, giving the electromagnetic power as a function of the maximum light intensity measured by a photomultiplier.

The optic fiber of the device is connected by its free end to light analysis means, such as photomultiplier or phototransistors. These will furnish a signal indicating the density of the field. FIG. 10 shows a curve of an experimental set up for a photomultiplier of the R.T.C.-XP-117 type, and a device such as that shown in FIG. 2 of the following dimensions: diameter of ampoule=15 mm; diameter of loop=10 mm. The Voltage of the electric signal delivered by the photomultiplier is plotted on the abscissa and the density of the electromagnetic power of the field is plotted on the ordinate.

The firing threshold is approximately 3 milliwatts per $cm^2$, and the sensitivity is 0.3 milliwatts per $cm^2$ and the response time of the device is on the order of several milliseconds.

It is to be noted that with the exception of the metallic loop (of small dimension in relation to the wavelength), there is no metallic conductor to be found in the field to be measured, which might have a disturbing influence on the radiation pattern.

Figure 11:
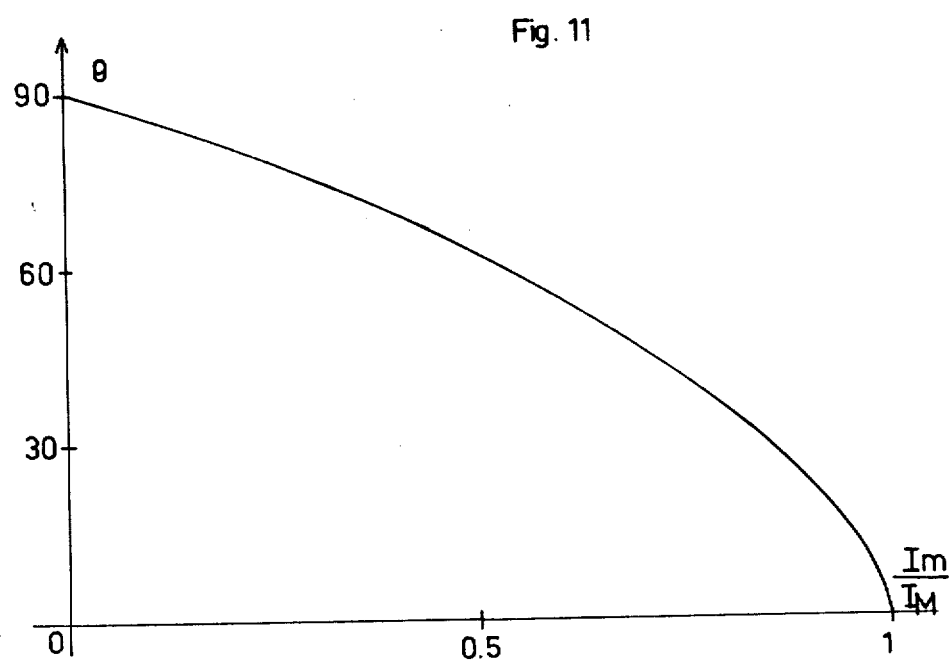
FIG. 11 is a standardization curve, giving the angle $\theta$ as a function, $I_m/I_M$ of the relationship of the minimum intensity to the maximum intensity, measured in the course of each rotation of the device.

FIG. 9 shows that the angle $\theta$ made by the electric field in relation to the rotation axis of the ampoule is the function of the $I_{min}/I_{Max}$ relationship, and FIG. 11 shows the corresponding response curve.

In practice, it is possible to determine the direction of E by carying out several measurements for each point with rotations around different axes, or even by aligning each point with the direction of E for an adjacent point.

The device is brought to firing level either by having a resonant frequency near the frequency of radiation, or by having several resonant circuits covering a range of frequencies, or by transmitting an electromagnetic firing pulse beforehand, at the frequency of the device, by means of a high frequency generator. This last process would be used in the case where the radiation frequency is not known or does not correspond to the resonant frequencies of the available devices, or else in the case where the power level of the radiation to be measured is insufficient to assure firing.

The described devices can be used in various fields, particularly:

in the medical field, to adjust electrotherapy dosages, to effect security controls, etc., industry, to detect electromagnetic leakage, to control radiation systems, for control of functions as in servocontrols, for protection of personnel, etc., in laboratory research, for the measurement of power radiated or transmitted by wave guide, to detect levels, etc., FIGS. 12, 13 and 14 show an embodiment for generation of a plasma within the framework of applications other than measurement or detection.

The device shown in these drawings comprises a glass tube 18 with an inlet opening 18a and a discharge opening 18b; this tube contains a metallic tubular casing 19 with a metallic cylindrical element 20 on the inside arranged along its axis and connected to it by metallic connections. This arrangement is mounted between internal annular bosses 18c; in the example, the connection is constructed of a metallic disk 21 at one end of the tubular casing. This disk is perforated with passages 21a to permit the passage of an ionizable gas coming from the inlet 18a of the tube.

At the other end, tubular casing 19 and cylindrical element 20 have annular extra thicknesses 19a and 20a facing each other.

Tubular casing 19, cylindrical element 20 and disk 21 form an inductor L whose inductance is a function of the geometric characteristics of the assembly. The extra thicknesses 19a and 20a form a capacitor C wose capacitance is a function of their geometric characteristics.

The whole assembly constitutes an oscillating circuit of which the geometric characteristics can be adjusted to have a resonant frequency $F_o$ which has a predetermined $LC = 1/(4\pi^2 F_o^2)$ relationship.

With R being the resistance of the oscillating circuit, the geometric characteristics of the elements are also adjusted such that the Q factor in a vacuum $Q_o = (2\pi L F_o)/R = 1/(C 2\pi F_o R)$ is as large as possible.

For example, an oscillating circuit with a resonant frequency of 2450 Megahertz and with a Q factor of approximately 150 can be obtained by using the following values:

diameter of the tubular casing: 14 mm
diameter of the cylindrical element: 6 mm
length of the tubular casing: 20 mm
external diameter of the annular thickness 10a: 12 mm
internal diameter of the annular thickness 19a: 8 mm
length of the thickness: 2 mm.

To generate plasma, this device is subjected to electromagnetic radiation of frequency near its resonant frequency $F_o$. The radiation preferably is oriented such that its electrical field is approximately parallel to the axis of the metallic tubular casing. This orientation allows for maximum coupling between the radiation field and the oscillating circuit of the device.

Figure 15:
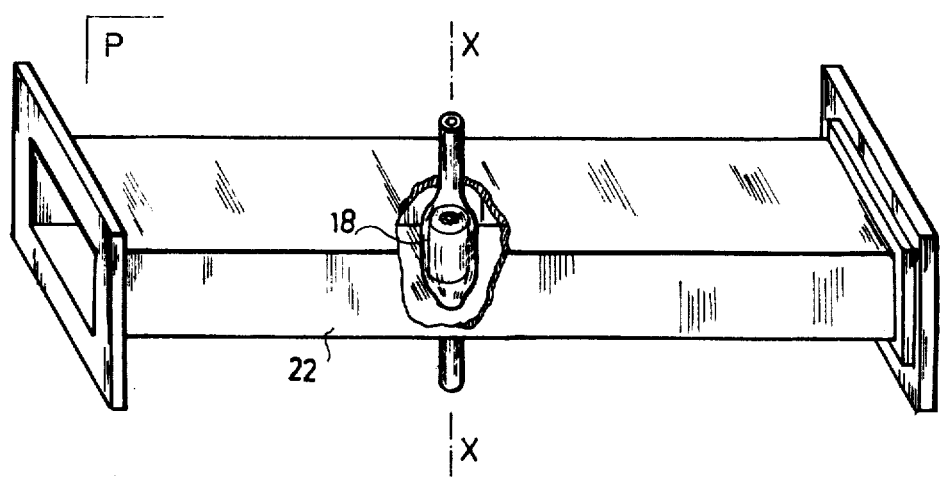
FIGS. 15 and 16 are respectively a perspective view of the device integrated into a waveguide with a partial cutout and a longitudinal cross section similar to the proceding figure.
Figure 16:
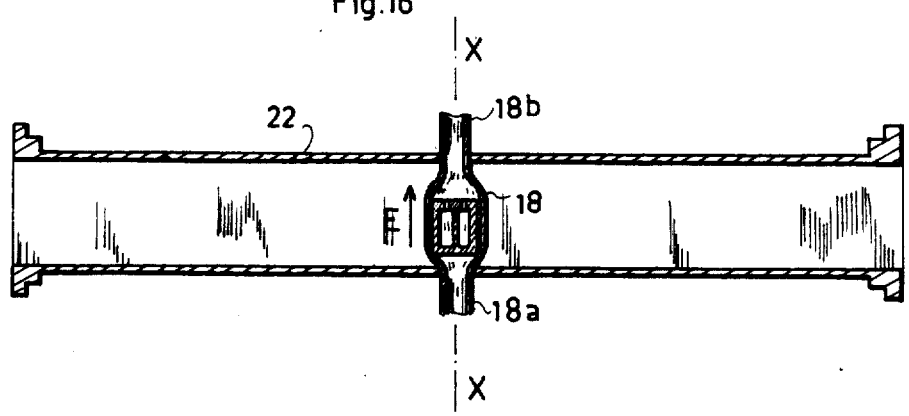

For example, as shown in FIGS. 15 and 16, the device can be arranged in a wave guide 22. This guide can be of standardized rectangular cross section (large faces: 86.36 mm: small faces: 43.18 mm).

Tubular casing 19 is arranged in the wave guide in such a manner that its axis is parallel to the small faces of the guide. The electrical field E of the waveguide is thus parallel to the axis of the tubular casing. The ends 18a and 18b of glass tube 18 pass through the guide walls through openings in the large faces. Besides, tubular casing 19 is arranged such that the axis XX' is contained in the longitudinal axial plane P of the guide; the position of this tubular casing along this axis is empirically adjusted to correspond to the maximum coupling between the tubular casing and the radiation field.

The gas passing through the tube is approximately 50 percent oxygen. The firing of the device is effected from an electromagnetic power of approximately 5 watts and permits creation of a plasma, at a low temperature and without hot points. The ionization is maintained and remains stable at this power level.

Such a device requires very low power and benefits from an extremely simple structure, without any accessory electric or electronic excitation circuit.

This device can be used for efficient and economical manufacture of ozone, and the absence of a hot point allows a good total yield of the reaction by avoiding thermal destruction of parts of the already formed ozone.

By using low energy and avoiding high temperatures, the device can also be used to sterilize or cleanse a given fluid passing through the tube, to produce a frequency and amplitude laser modulation, to produce a gas analysis for plasma spectroscopy, in metallurgy for a small diameter plasma torch of only a few mm, in chemistry for the creation of free radicals and associated compounds.

What is claimed is:

1. A device for the generation of an ionized gas for measurement of ultra-high frequency electromagnetic radiation comprising a sealed casing containing an ionizable gas, an oscillating circuit comprising an inductor connected across a capacitor in said casing, said inductor and capacitor being adapted to resonate at a predetermined resonance frequency $F_o$ in the ultra-high frequency range and to have a Q factor in a vacuum $Q_o$ of greater than 1, in order to render said circuit capable of providing a firing voltage across said capacitor for ionizing said gas when said inductor receives electromagnetic radiation near the frequency $F_o$, optical conducting means having one end attached to said casing near said capacitor, and means attached to the other end of said optical conducting means for analyzing light transmitted from said conductor and driving a signal representative of the power of the electromagnetic radiation.

2. A process for the generation of an ionized gas for measurement of ultra-high frequency electromagnetic radiation comprising providing a sealed casing containing an ionizable gas and a oscillating circuit comprising an inductor connected across a capacitor and adapted to resonate at a resonance frequency in the ultra-high frequency range and to have a Q factor in a vacuum of greater than 1 whereby said circuit is capable of producing a firing voltage across said capacitor and ionizing said gas when said inductor receives electromagnetic radiation near said resonance frequency, subjecting said inductor to a source of ultra-high frequency radiation near said resonance frequency and thereby ionizing said gas, transmitting the light generated by the ionized gas to a light analyzing means by means of an optical conductor having one end thereof attached to said casing near said capacitor, and analyzing the light generated by the ionized gas as a function of the power of the electromagnetic radiation.

3. Device as in claim 1, wherein the inductor and the capacitor of the oscillating circuit are adapted to confer on this circuit a Q factor in a vacuum which is approximately 100, with parameters of the oscillating circuit satisfying the $$(2\pi F_o L)/R = 1/(2\pi F_o CR) = Q_o \geq 100$$

relationship wherein L is the reactance of the inductor, C the capacitance of the capacitor and R the resistance of the circuit.

4. Device as in claim 1, wherein the inductor is constructed of a metallic loop which is of small diameter in relation to the wave length of radiation, and the capacitor is formed of two metallic elements, attached at the two ends of the loop and facing each other in close proximity.

5. Device as in claim 4, wherein one of the elements of the capacitor includes an open cavity into which the other elements penetrates.

6. Device as in claim 1, wherein said incductor is a metallic tubular enclosure provided on the inside of a metallic cylindrical element arranged along the axis of the enclosure and connected at points with the enclosure by a metallic connection.

7. Device as in claim 6, wherein the metallic connection between the tubular enclosure and cylindrical element is a perforated metallic disk at one end of the tubular enclosure and of the cylindrical element, and the other ends of the enclosure and element having relatively greater annular thicknesses opposite each other, to form the capacitor of the oscillating circuit.

8. Device as in claim 1, wherein the casing is a tube or an ampoule of a dielectric material.

9. Device as in claim 1, wherein the ionizable gas is in the ampoule at a pressure corresponding to the minimum firing voltage of the gas.

10. Device as in claim 1, and including a plurality of oscillating circuits calibrated at different frequencies staggered through a predetermined frequency range.

11. Device as in claim 1 and wherein the casing is a translucent or transparent material.

12. A process as in claim 2 and including rotating said casing through an angle of 180° and measuring the maximum amplitude of said electromagnetic radiation as a function of the maximum light intensity.

13. A process as in claim 12 and including measuring the relationship of the maximum amplitude and minimum amplitude of the radiation to the angle of the radiation for determining the orientation of the electric field of the electromagnetic radiation.

14. A process as in claim 12 and including calibrating the inductor to a resonance frequency near the frequency of the radiation being measured.

15. A process as in claim 2 and including providing a plurality of said oscillating circuits within said casing for measurement of electromagnetic radiation within a known range, said oscillating circuits being calibrated to frequencies within said range whereby the firing frequency bands are adjacent.

16. A process as in claim 2 and including transmitting the generated light to a light analyzing means by means of an optical conductor having one end thereof attached to said casing near said capacitor.

* * * * *